(12) United States Patent
Kataoka

(10) Patent No.: US 7,465,883 B2
(45) Date of Patent: Dec. 16, 2008

(54) PLATE-REINFORCED WIRING CIRCUIT BOARD

(75) Inventor: Koji Kataoka, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/637,022

(22) Filed: Dec. 12, 2006

(65) Prior Publication Data

US 2007/0134945 A1 Jun. 14, 2007

(30) Foreign Application Priority Data

Dec. 13, 2005 (JP) ............................. 2005-358401

(51) Int. Cl.
*H05K 7/02* (2006.01)
(52) U.S. Cl. .................... 174/255; 361/749; 361/767; 361/807; 361/808; 174/250; 174/254
(58) Field of Classification Search ............... 361/748, 361/749, 760, 807, 736, 767, 808; 174/254, 174/250, 260, 255
See application file for complete search history.

(56) References Cited

U.S. PATENT DOCUMENTS

| 5,042,971 A * | 8/1991 | Ambrose .................... 439/77 |
| 5,163,470 A * | 11/1992 | Maeshiba ................... 137/448 |
| 6,512,676 B1 * | 1/2003 | Crapisi et al. ............... 361/752 |

FOREIGN PATENT DOCUMENTS

| JP | 5-34127 Y2 | 8/1993 |
| JP | 10-135581 A | 5/1998 |

\* cited by examiner

*Primary Examiner*—Jeremy C Norris
*Assistant Examiner*—Dameon E Levi
(74) *Attorney, Agent, or Firm*—Sughrue Mion, PLLC

(57) ABSTRACT

The object of the present invention is to provide a plate-reinforced wiring circuit board in which the tearing occurring upon flexing can be sufficiently prevented. The present invention relates to a plate-reinforced wiring circuit board, which comprises a wiring circuit board; and a reinforcing plate disposed on a given region of the wiring circuit board, said reinforcing plate having a edge which has a curved part intersecting or having contact with a edge of the wiring circuit board.

7 Claims, 5 Drawing Sheets

PLATE-REINFORCED WIRING CIRCUIT BOARD

FIELD OF THE INVENTION

The present invention relates to a plate-reinforced wiring circuit board.

BACKGROUND OF THE INVENTION

Flexible wiring circuit boards are used in electronic appliances in which a wiring circuit is required to have flexibility, such as hard-disk drives. For the purpose of improving workability and suitability for connection, a reinforcing plate is superposed on flexible wiring circuit boards.

However, in some cases, when a plate-reinforced flexible wiring circuit board is repeatedly flexed, a tear originated from the intersection point of the edge of the flexible wiring circuit board and the edge of the reinforcing plate may be developed.

Patent document 1 describes a flexible printed circuit board in which the angle formed by the end line of the reinforcing plate and the visible outline of the flexible printed circuit board is set to be 15 degrees or larger and 30 degrees or smaller.

Furthermore, patent document 2 describes a plate-reinforced flexible circuit board in which a central part of the edge of the reinforcing plate has a partly-protruding shape such as a circular-arc shape or a trapezoidal shape.

Patent Document 1: JP-A-10-135581
Patent Document 2: JP-UM-B-05-034127

SUMMARY OF THE INVENTION

However, the flexible wiring circuit boards to be mounted on electronic appliances such as hard-disk drives are thin and receive a high bending stress upon flexing.

In the flexible printed circuit board described in patent document 1, a tear transmits along a linear peripheral part of the reinforcing plate upon flexing. As a result, wire breakage does not occur.

Also in the plate-reinforced flexible circuit board described in patent document 2, a tear occurring upon flexing originated from the intersection point of the edge of the reinforcing plate and the edge of the flexible circuit board cannot be sufficiently prevented.

An object of the invention is to provide a plate-reinforced wiring circuit board in which the tear occurring upon flexing can be sufficiently prevented.

Namely, the present invention relates to the followings.
(1) A plate-reinforced wiring circuit board, which comprises:
   a wiring circuit board; and
   a reinforcing plate disposed on a given region of the wiring circuit board,
   said reinforcing plate having a edge which has a curved part intersecting or having contact with a edge of the wiring circuit board.
(2) The plate-reinforced wiring circuit board according to (1), wherein the curved part is a circular-arc part having contact with the edge of the wiring circuit board.
(3) The plate-reinforced wiring circuit board according to (1), wherein the curved part is a circular-arc part intersecting with the edge of the wiring circuit board.
(4) The plate-reinforced wiring circuit board according to (3), wherein the edge of the wiring circuit board and a tangent to the circular-arc part form an angle of 15 degrees or smaller at the intersection point of the circular-arc part and the edge of the wiring circuit board.
(5) The plate-reinforced wiring circuit board according to (1), wherein the wiring circuit board is a flexible wiring circuit board comprising an insulating layer and a wiring pattern superposed thereon.
(6) The plate-reinforced wiring circuit board according to (1), wherein the reinforcing plate comprises a metal plate.

According to the present invention, the plate-reinforced wiring circuit board includes a wiring circuit board and a reinforcing plate disposed on a given region of the wiring circuit board, and the edge of the reinforcing plate has a curved part intersecting or having contact with the edge of the wiring circuit board.

According to the plate-reinforced wiring circuit board of the invention, the edge of the reinforcing plate has a curved part intersecting or having contact with the edge of the wiring circuit board. Therefore, the wiring circuit board is sufficiently prevented from tearing upon flexing. Consequently, wire breakage does not occur.

The curved part may be a circular-arc part having contact with the edge of the wiring circuit board. In this case, the wiring circuit board is more sufficiently prevented from tearing upon flexing.

The curved part may be a circular-arc part intersecting with the edge of the wiring circuit board. In this case, the wiring circuit board is sufficiently prevented from tearing upon flexing.

At the intersection point of the circular-arc part and the edge of the wiring circuit board, the angle formed by the tangent to the circular-arc part and the edge of the wiring circuit board is preferably 15 degrees of smaller. In this case, the wiring circuit board is more sufficiently prevented from tearing upon flexing.

The wiring circuit board may be a flexible wiring circuit board including an insulating layer and a wiring pattern superposed thereon.

Flexible wiring circuit boards have high flexibility. Even in this case, since the edge of the reinforcing plate has a curved part intersecting or having contact with the edge of the-flexible wiring circuit board, the flexible wiring circuit board is sufficiently prevented from tearing upon flexing. Consequently, wire breakage does not occur. As a result, the flexible wiring circuit board has enhanced reliability.

The reinforcing plate may include a metal plate. In this case, the plate-reinforced wiring circuit board has improved handling ability and improved strength.

According to the invention, since the edge of the reinforcing plate has a curved part intersecting or having contact with the edge of the wiring circuit board, the wiring circuit board is sufficiently prevented from tearing upon flexing. Consequently, wire breakage does not occur.

Figure 1:
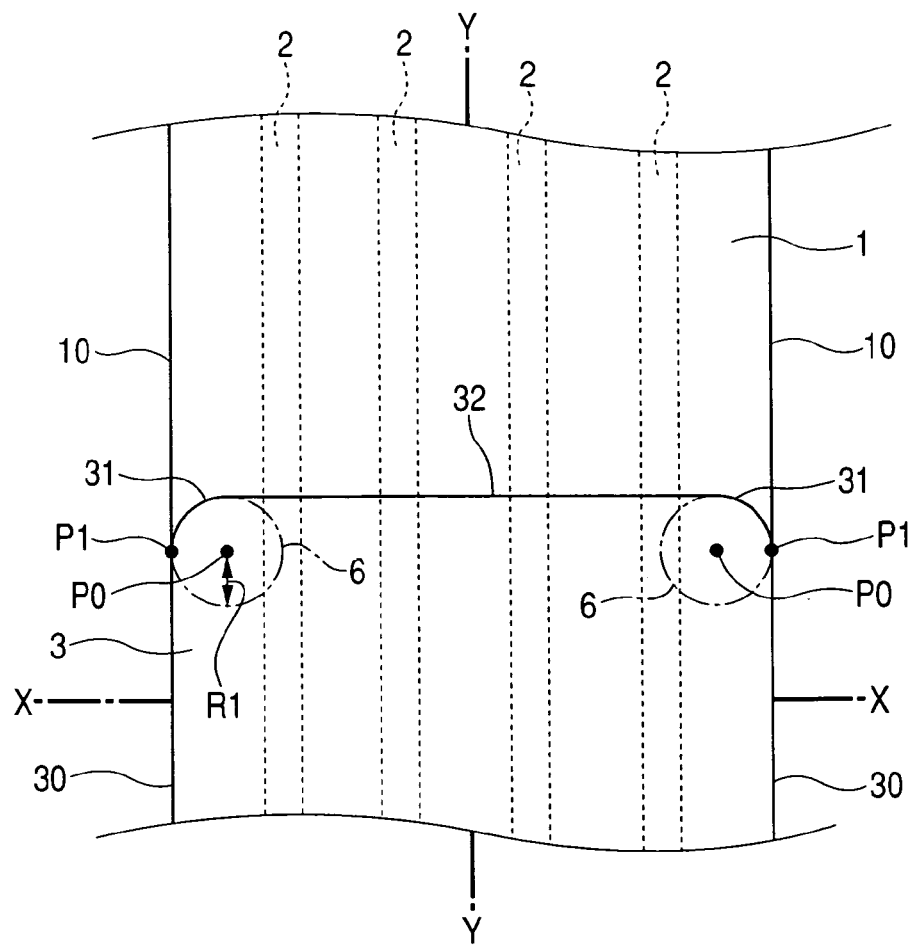
FIG. 1 is a diagrammatic plan view of the backside of the first embodiment of the plate-reinforced wiring circuit board.

DESCRIPTION OF REFERENCE NUMERALS AND SIGNS 1 base insulating layer
2 wiring pattern
3 reinforcing plate
4 plating resist
5 cover insulating layer
6 circle
10 edge
100 flexible wiring circuit board
30 side part
31 circular-arc part
32 end part
R1, R2, R3 radius of curvature
P0 center
P1 tangent point
P2 intersection point
T tangent
d1, d2 amount of positional shifting

DETAILED DESCRIPTION OF THE INVENTION

Plate-reinforced flexible wiring circuit boards will be explained below as embodiments of the plate-reinforced wiring circuit board of the invention.

(1) FIRST EMBODIMENT (1-1) Constitution of Wiring Circuit Board

Figure 2:
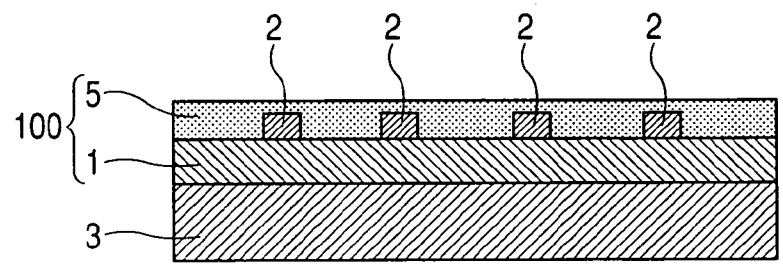
FIG. 2 is a sectional view taken on line X-X of the plate-reinforced wiring circuit board shown in FIG. 1.
Figure 3:
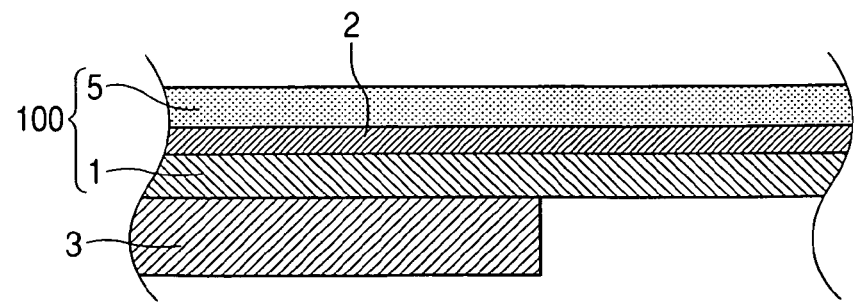
FIG. 3 is a sectional view taken on line Y-Y of the plate-reinforced wiring circuit board shown in FIG. 1.

FIG. 1 is a diagrammatic plan view of the backside of the first embodiment of the plate-reinforced wiring circuit board. FIG. 2 is a sectional view taken on line X-X of the plate-reinforced wiring circuit board shown in FIG. 1. FIG. 3 is a sectional view taken on line Y-Y of the plate-reinforced wiring circuit board shown in FIG. 1.

As shown in FIG. 2 and FIG. 3, a plurality of wiring patterns 2 including, for example, copper are disposed in parallel stripe arrangement on a base insulating layer 1 including, for example, polyimide. A cover insulating layer 5 including, for example, a polyimide film is formed so as to cover the wiring pattern 2. The base insulating layer 1, wiring pattern 2, and cover insulating layer 5 constitute a flexible wiring circuit board 100.

Furthermore, a reinforcing plate 3 including, for example, a metal plate is formed on a given region of the backside of the base insulating layer 1. The metal plate is made of, for example, stainless steel. The thickness of the reinforcing plate 3 is preferably in the range of from 15 to 300 μm. Accordingly, the plate-reinforced wiring circuit board can have sufficient flexibility and sufficient strength.

As shown in FIG. 1, the edge of the reinforcing plate 3 has two side parts 30 respectively on both sides, circular-arc parts 31, and an end part 32. In this embodiment, the reinforcing plate 3 is formed so that each of the side parts 30 thereof and part of the edge 10 of the base insulating layer 1 are located in a collinear position.

The circular-arc parts 31 each have a shape which coincides with part of a circle 6 having a given radius of curvature R1. These circular-arc parts 31 are respectively formed so as to being into contact with the edge 10 of the base insulating layer 1 at a tangent point P1. Consequently, the angle formed by the edge 10 and the segment including the tangent point P1 and the center P0 of the circle 6 is 90 degrees. At the tangent point P1, the tangent to the circular-arc part 31 coincides with the edge 10 of the base insulating layer 1. Namely, at the tangent point P1, the angle formed by the tangent to the circular-arc part 31 and the edge 10 of the base insulating layer 1 is 0 degree.

(1-2) Processes for Producing Wiring Circuit Board

A process for producing the plate-reinforced wiring circuit board shown in FIG. 1 will be explained below. The process to be explained herein as an example is the semi-additive method.

FIGS. 4A to 4E are sectional views for illustrating steps in a process for producing the wiring circuit board by the semi-additive method.

Figure 4A:
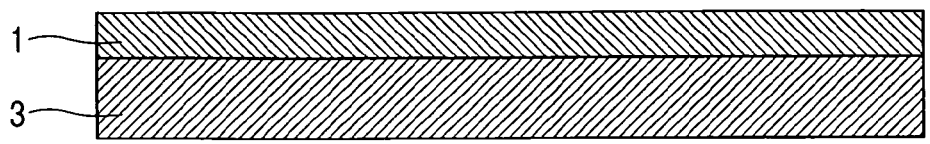
FIGS. 4A to 4E are sectional views for illustrating steps in the process for producing a wiring circuit board by the semi-additive method.

First, as shown in FIG. 4A, a base insulating layer 1 is formed on a reinforcing plate 3 including a metal plate.

Figure 4B:
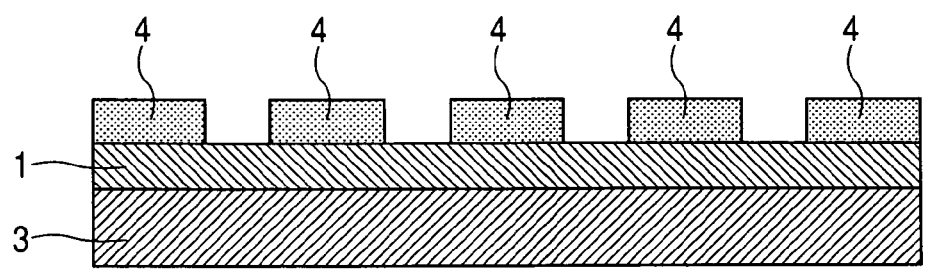

Subsequently, a plating resist 4 is formed on the base insulating layer 1 as shown in FIG. 4B. The plating resist 4 has groove parts having a given pattern and extending to the surface of the base insulating layer 1. The plating resist 4 is formed, for example, by forming a resist film on the base insulating layer 1 with a dry film resist, etc., exposing the resist film to light according to the given pattern, and then developing the resist film.

Figure 4C:
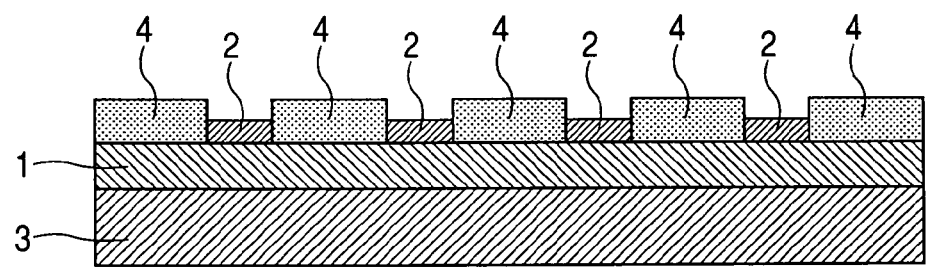

A wiring pattern 2 is then formed in the groove parts by electroplating as shown in FIG. 4C.

Figure 4D:
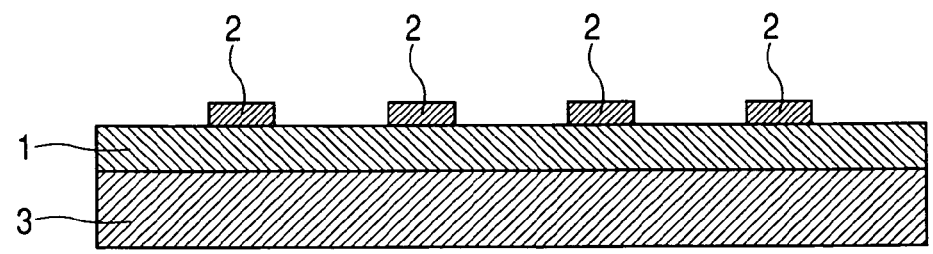

Subsequently, the plating resist 4 is removed by chemical etching (wet etching) or stripping as shown in FIG. 4D.

Figure 4E:
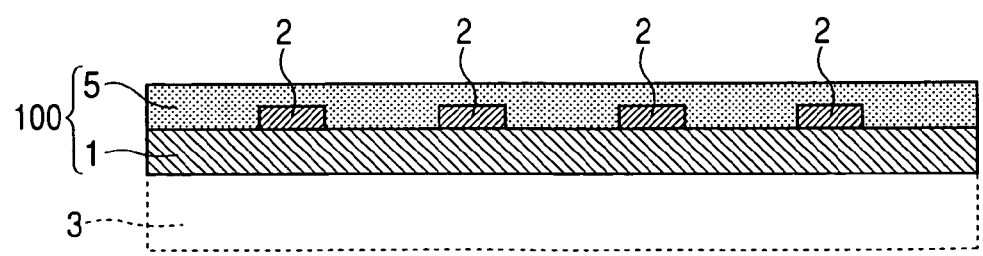

A cover insulating layer 5 is then formed so as to cover the wiring pattern 2 as shown in FIG. 4E. Furthermore, the reinforcing plate 3 on the back of the base insulating layer 1 is partly removed by etching so as to leave a given region of the reinforcing plate 3. Thus, the plate-reinforced wiring circuit board shown in FIG. 1 is completed.

Processes for producing the wiring circuit board are not limited to the semi-additive method as described above, and other methods such as, the subtractive method may be used.

(1-3) Advantage of the First Embodiment

In this embodiment of the plate-reinforced wiring circuit board, the edge of the reinforcing plate 3 has circular-arc parts 31 having contact with the edge 10 of the base insulating layer 1. Therefore, the flexible wiring circuit board 100 is more sufficiently prevented from tearing upon flexing. Consequently, wire breakage does not occur.

(2) SECOND EMBODIMENT

Figure 5:
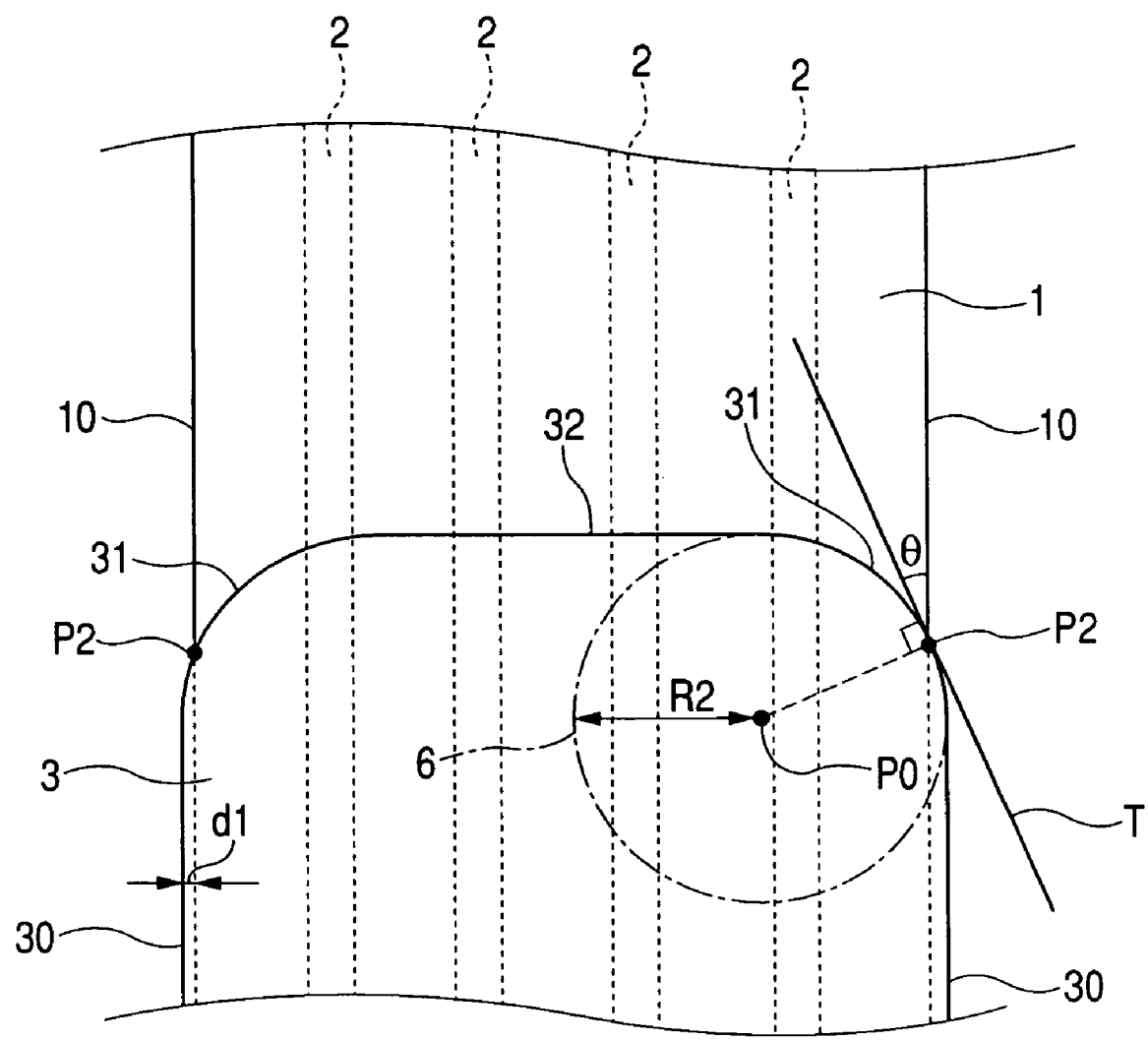
FIG. 5 is a diagrammatic plan view of the backside of the second embodiment of the plate-reinforced wiring circuit board.

FIG. 5 is a diagrammatic plan view of the backside of the second embodiment of the plate-reinforced wiring circuit board.

The second embodiment of the plate-reinforced wiring circuit board differs from the first embodiment of the plate-reinforced wiring circuit board in the following points.

As shown in FIG. 5, the edge of the reinforcing plate 3 has two side parts 30 respectively on both sides, circular-arc parts 31 which are curved outward, and an end part 32. In this embodiment, the two side parts 30 of the reinforcing plate 3 are located apart from the edge 10 of the base insulating layer 1 in the direction perpendicular to the lengthwise direction for the wiring pattern 2. Namely, the side parts 30 have positional shifting outward from the edge 10 in an amount of d1. This positional shifting occurs in a production step.

The circular-arc parts 31 each have a shape which coincides with part of a circle 6 having a given radius of curvature R2. These circular-arc parts 31 each are formed so as to intersect with the edge 10 of the base insulting layer 1 at an intersection point P2. The angle formed by the tangent T to the circular-arc part 31 and the edge 10 of the base insulating layer 1 at the intersection point P2 is expressed as θ.

In this embodiment of the plate-reinforced wiring circuit board, the edge of the reinforcing plate 3 has circular-arc parts 31 having contact with the edge 10 of the base insulating layer 1. Therefore, the flexible wiring circuit board 100 is more sufficiently prevented from tearing upon flexing. Consequently, wire breakage does not occur.

In particular, it is preferable that the angle θ formed by the tangent T to each circular-arc part 31 and the edge 10 of the base insulating layer 1 be 15 degrees or smaller. This constitution more sufficiently prevents the base insulating layer 1 from tearing upon flexing.

The amount of positional shifting d1, i.e., the distance between the edge 10 of the base insulating layer 1 and each side part 30 of the reinforcing plate 3, is preferably from 0 to 50 μm.

In view of the amount of positional shifting d1, it is preferable that the radius of curvature R2 of each circular-arc part 31 of the reinforcing plate 3 be from 0.5 to 3 mm. This constitution more sufficiently prevents the base insulating layer 1 from tearing upon flexing. It is more preferable that the radius of curvature R2 of each circular-arc part 31 of the reinforcing plate 3 be from 1.5 to 3 mm. This constitution even more sufficiently prevents the base insulating layer 1 from tearing upon flexing.

(3) THIRD EMBODIMENT

Figure 6:
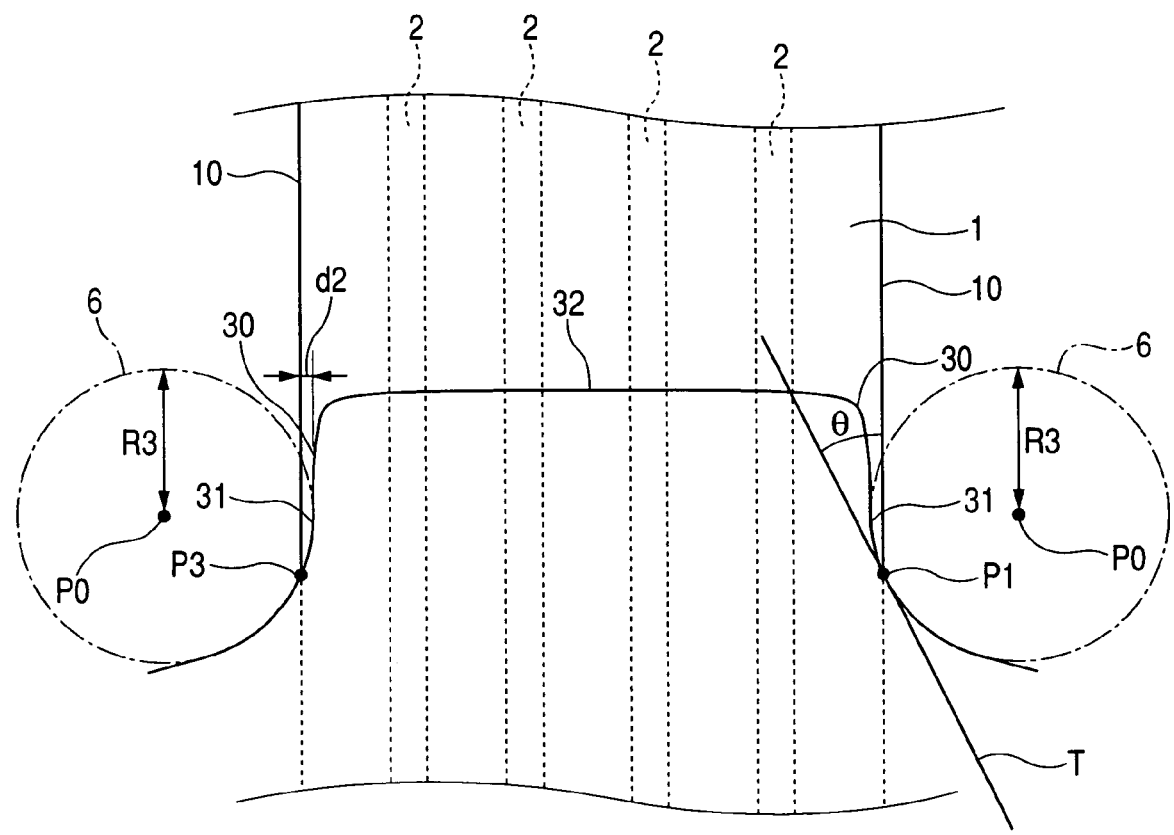
FIG. 6 is a diagrammatic plan view of the backside of the third embodiment of the plate-reinforced wiring circuit board.

FIG. 6 is a diagrammatic plan view of the backside of the third embodiment of the plate-reinforced wiring circuit board.

The third embodiment of the plate-reinforced wiring circuit board differs from the first embodiment of the plate-reinforced wiring circuit board in the following points.

As shown in FIG. 6, the edge of the reinforcing plate 3 has two side parts 30 respectively on both sides, circular-arc parts 31 which are curved inward, and an end part 32. In this embodiment, the two side parts 30 of the reinforcing plate 3 are located apart from the edge 10 of the base insulating layer 1 in the direction perpendicular to the lengthwise direction for the wiring pattern 2. Namely, the side parts 30 have positional shifting inward from the edge 10 in an amount of d2. This positional shifting occurs in a production step.

The circular-arc parts 31 each have a shape which coincides with part of a circle 6 having a given radius of curvature R3. These circular-arc parts 31 are formed so as to intersect with the edge 10 of the base insulting layer 1 at intersection points P1 and P3, respectively. The angle formed by the tangent T to the circular-arc part 31 and the edge 10 of the base insulating layer 1 at each of the intersection points P1 and P3 is expressed as θ.

In this embodiment of the plate-reinforced wiring circuit board, the edge of the reinforcing plate 3 has circular-arc parts 31 having contact with the edge 10 of the base insulating layer 1. Therefore, the flexible wiring circuit board 100 is more sufficiently prevented from tearing upon flexing. Consequently, wire breakage does not occur.

In particular, it is preferable that the angle θ formed by the tangent T to each circular-arc part 31 and the edge 10 of the base insulating layer 1 be 15 degrees or smaller. This constitution more sufficiently prevents the base insulating layer 1 from tearing upon flexing.

The amount of positional shifting d2, i.e., the distance between the edge 10 of the base insulating layer 1 and each side part 30 of the reinforcing plate 3, is preferably from 0 to 50 μm.

In view of the amount of positional shifting d2, it is preferable that the radius of curvature R3 of each circular-arc part 31 of the reinforcing plate 3 be from 0.5 to 3 mm. This constitution more sufficiently prevents the base insulating layer 1 from tearing upon flexing. It is more preferable that the radius of curvature R3 of each circular-arc part 31 of the reinforcing plate 3 be from 1.5 to 3 mm. This constitution even more sufficiently prevents the base insulating layer 1 from tearing upon flexing.

(4) OTHER EMBODIMENTS

Figure 7:
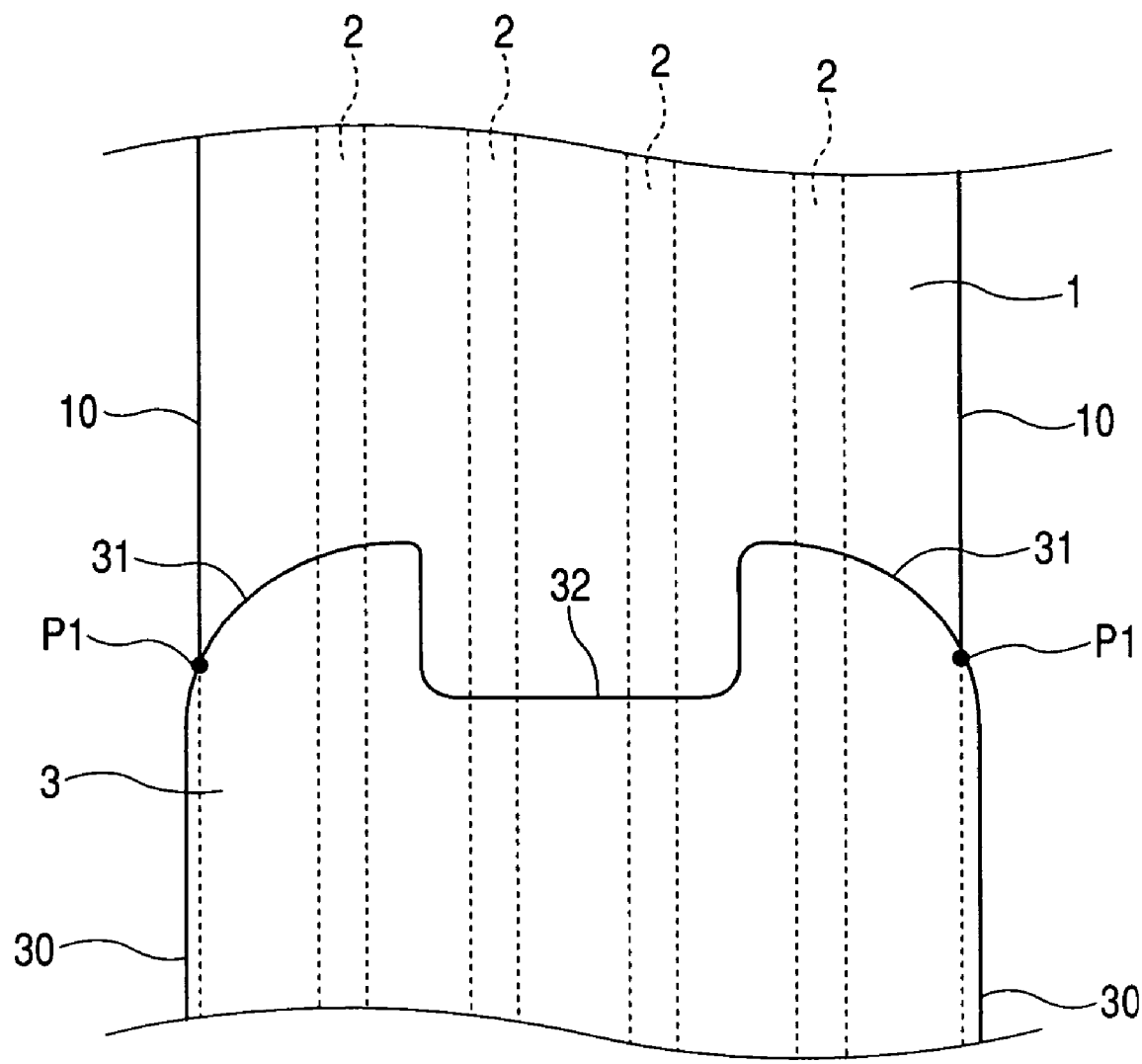
FIG. 7 is a diagrammatic plan view of the backside of another embodiment of the plate-reinforced wiring circuit board.

In the reinforcing plate 3, the shapes of those parts of the edge except the circular-arc parts 31 should not be construed as being limited to the shapes in the embodiments described above. Namely, those parts of the edge of the reinforcing plate 3 except the circular-arc parts 31 intersecting or having contact with the edge 10 of the base insulating layer 1 may be formed so as to have any desired shape effective in diminishing stress concentration at the edge of the reinforcing plate 3. For example, those parts of the edge of the reinforcing plate 3 may include an end part 32 having a curved shape as shown in FIG. 7.

The material of the reinforcing plate 3 is not limited to stainless steel, and other materials including aluminum may be used.

The materials of the base insulating layer 1 and cover insulating layer 5 are not limited to polyimides, and other materials such as poly(ethylene terephthalate), poly(ethernitrile)s, and polyethersulfones may be used.

The material of the wiring pattern 2 is not limited to copper, and other metallic materials such as copper alloys, gold, and aluminum may be used.

In the embodiments described above, the reinforcing plate 3 formed on the backside of the base insulating layer 1 is processed into a given shape by etching. However, use may be made of a method in which a reinforcing plate 3 processed into a given shape is bonded to the backside of a base insulating layer 1.

(5) CORRESPONDENCE OF CONSTITUENT ELEMENTS IN THE CLAIMS TO PARTS IN THE EMBODIMENTS

Each circular-arc part 31, the base insulating layer 1, and the flexible wiring circuit board 100 in each of the embodiments described above correspond to the curved part, insulating layer, and wiring circuit board in the claims, respectively.

EXAMPLES (1) Production of Plate-Reinforced Wiring Circuit Boards of Examples and Comparative Example In Examples 1 to 4, flexible circuit boards for hard disks were produced as examples of the plate-reinforced wiring circuit board shown in FIG. 1. For producing the plate-reinforced wiring circuit boards, the semi-additive method described above was used. The term "flexible circuit board for hard disks" as used herein means a platy substrate which is used, for example, in a hard-disk drive for positioning a magnetic head on a desired track of a magnetic disk. The metal plate in the flexible circuit board for hard disks corresponds to the reinforcing plate.

The thickness of the base insulating layer 1 is 10 μm, and the thickness of the cover insulating layer 5 is 5 μm. The thickness of the reinforcing plate 3 is 50 μm. The wiring pattern 2 has a thickness of 10 μm and a wiring line width of 30 μm, and the distance between wiring lines of the wiring pattern 2 is 30 μm.

In Comparative Example, a flexible circuit board for hard disks was produced as a plate-reinforced wiring circuit board in the same manner as in the Examples, except for the shape of the edge of the reinforcing plate 3. In the plate-reinforced wiring circuit board of Comparative Example, those parts of the edge of the reinforcing plate 3 which intersect with the edge 10 of the base insulating layer 1 have a linear shape.

Table 1 shows the dimension and shape of the edge of the reinforcing plate 3 of each of the plate-reinforced wiring circuit boards of Examples 1 to 4 and Comparative Example.

TABLE 1

|  | Example 1 | Example 2 | Example 3 | Example 4 | Comparative Example |
|---|---|---|---|---|---|
| Radius of curvature [mm] | 1.0 | 0.5 | 1.0 | 1.5 | straight line |
| Angle [degree] | 0 | 15 | 10 | 5 | 15 |
| Amount of positional shifting from reinforcing plate [µm] | 0 | 17 | 15 | 5.7 | 0 |

The reinforcing plate 3 of the plate-reinforced wiring circuit board of Example 1 has the shape shown in FIG. 1. The reinforcing plates 3 of the plate-reinforced wiring circuit boards of Examples 2 to 4 have the shape shown in FIG. 5.

(2) Evaluation

The plate-reinforced wiring circuit boards of Examples 1 to 4 and Comparative Example each were used in a hard-disk drive for 20 days. As a result, the plate-reinforced wiring circuit boards of Examples 1 to 4 suffered no tearing. In contrast, the plate-reinforced wiring circuit board of Comparative Example suffered tearing in some cases.

It can be seen from the results that the flexible wiring circuit board 100 is prevented from tearing upon flexing without fail when the edge of the reinforcing plate 3 has circular-arc parts 31 intersecting or having contact with the edge 10 of the base insulating layer 1.

INDUSTRIAL APPLICABILITY

The invention can be effectively used for, for example, wiring in producing various electronic parts to be used in electronic appliances.

While the present invention has been described in detail and with reference to specific embodiments thereof, it will be apparent to one skilled in the art that various changes and modifications can be made therein without departing from the scope thereof.

This application is based on Japanese patent application No. 2005-358401 filed Dec. 13, 2005, the entire contents thereof being hereby incorporated by reference.

What is claimed is:

1. A plate-reinforced wiring circuit board, which comprises: a wiring circuit board; and a reinforcing plate disposed on a given region of the wiring circuit board, said reinforcing plate having an edge which has a curved part having contact with an edge of the wiring circuit board,
   wherein a tangent to the curved part and the edge of the wiring circuit board form a 0° angle at the intersection point of the curved part and the edge of the wiring circuit board.

2. The plate-reinforced wiring circuit board according to claim 1, wherein the curved part is a circular-arc part having contact with the edge of the wiring circuit board.

3. The plate-reinforced wiring circuit board according to claim 1, wherein the wiring circuit board is a flexible wiring circuit board comprising an insulating layer and a wiring pattern superposed thereon.

4. The plate-reinforced wiring circuit board according to claim 1, wherein the reinforcing plate comprises a metal plate.

5. A plate-reinforced wiring circuit board, which comprises:
   a wiring circuit board, and
   a reinforcing plate disposed on a given region of the wiring circuit board,
   said reinforcing plate having an edge which has a curved part intersecting with an edge of the wiring circuit board,
   wherein the curved part is a circular-arc part, and
   wherein the edge of the wiring circuit board and a tangent to the circular-arc part form an angle of 15 degrees or smaller at the intersection point of the circular-arc part and the edge of the wiring circuit board.

6. The plate-reinforced wiring circuit board according to claim 5, wherein the wiring circuit board is a flexible wiring circuit board comprising an insulating layer and a wiring pattern superposed thereon.

7. The plate-reinforced wiring circuit board according to claim 5, wherein the reinforcing plate comprises a metal plate.

* * * * *